(12) United States Patent
Coln et al.

(10) Patent No.: US 8,837,099 B2
(45) Date of Patent: Sep. 16, 2014

(54) GUARDED ELECTRICAL OVERSTRESS PROTECTION CIRCUIT

(75) Inventors: Michael Coln, Lexington, MA (US);
Gary Carreau, Plaistow, NH (US);
Yoshinori Kusuda, Woburn State, MA (US)

(73) Assignee: Analog Devices, Inc., Norwood, MA (US)

( * ) Notice: Subject to any disclaimer, the term of this patent is extended or adjusted under 35 U.S.C. 154(b) by 731 days.

(21) Appl. No.: 12/647,067

(22) Filed: Dec. 24, 2009

(65) Prior Publication Data

US 2011/0038083 A1    Feb. 17, 2011

Related U.S. Application Data

(60) Provisional application No. 61/234,482, filed on Aug. 17, 2009.

(51) Int. Cl.
*H02H 9/00* (2006.01)
*H01L 27/02* (2006.01)

(52) U.S. Cl.
CPC ............................ *H01L 27/0255* (2013.01)
USPC ..................................................... 361/56

(58) Field of Classification Search
USPC .................................. 361/56, 111
See application file for complete search history.

(56) References Cited

U.S. PATENT DOCUMENTS

| 6,249,410 | B1 | 6/2001 | Ker et al. |
| 6,456,472 | B1 | 9/2002 | Beriault |
| 6,693,780 | B2 * | 2/2004 | Spehar et al. ............ 361/56 |
| 6,704,180 | B2 * | 3/2004 | Tyler et al. ............. 361/56 |
| 6,777,996 | B2 | 8/2004 | Smith, Jr. |
| 7,356,588 | B2 * | 4/2008 | Stineman et al. ....... 709/224 |
| 7,545,134 | B2 * | 6/2009 | Harriman ............... 323/351 |
| 2008/0106836 | A1 | 5/2008 | Benzer |

OTHER PUBLICATIONS

International Search Report dated Oct. 7, 2010, in counterpart International application No. PCT/US2010/044876.

* cited by examiner

*Primary Examiner* — Rexford Barnie
*Assistant Examiner* — Tien Mai
(74) *Attorney, Agent, or Firm* — Kenyon & Kenyon, LLP

(57) ABSTRACT

Disclosed embodiments are directed to an electrical overstress protection circuit. The electrical overstress protection circuit may include an intermediate node receiving a reference voltage, a first pair of clamp devices, having opposite polarity, clamping an input signal line to the intermediate node, and a second pair of clamp devices, each clamping the intermediate node to one of two reference potentials. The electrical overstress protection circuit may also include a filter connected to the intermediate node to reduce noise at the intermediate node.

28 Claims, 5 Drawing Sheets

400

GUARDED ELECTRICAL OVERSTRESS PROTECTION CIRCUIT

CROSS-REFERENCE TO RELATED APPLICATIONS

This application claims priority under 35 U.S.C. §119 to U.S. Provisional Patent Application No. 61/234,482, filed on Aug. 17, 2009 and entitled "A Guarded Electrical Overstress Protection Circuit Providing Signal Chain Testing," which is incorporated herein by reference in its entirety.

BACKGROUND

One challenge in developing monolithic mixed-signal semiconductor products occurs when designing robust protection circuitry for low-level input pins. Protection may be provided to prevent damage to the low-level input pins from electrical overstress (EOS) events that result from over current or over voltage events that occur while a device is operating. Conventional EOS protection circuitry typically includes clamp circuits extending from an input pin to power supply rails. These clamps, modeled as diode junctions, will shunt excessive input signals to corresponding low impedance power supplies, thus protecting the circuitry from unexpected spikes in the input signals.

FIG. 1 illustrates conventional EOS protection circuitry 100. An input signal IN will be received on an input signal line 110. A first diode D1 will connect the input signal line 110 to a supply voltage and a second diode D2 will connect the input signal line 110 to ground.

Generally a diode will only allow current to flow in a single direction (i.e., when the diode is forward biased), however, diodes do not prevent all the current from flowing in the opposite direction (i.e., when the diode is in a reverse biased state). As seen in FIG. 1, a small amount of leakage current will leak from the supply and ground onto the input signal line.

Under normal operating conditions, the reverse leakage currents of the diodes may exceed the required specification for input leakage/bias current of critical signal pins in the remaining signal chain. For example, for digital X-ray medical imaging, a data acquisition chip is desired that will digitize detector currents from photodiodes/photoconductors on the imaging panel. These detector currents may be in the picoampere range, and conventional clamp circuitry capable of delivering electrostatic discharge (ESD) and latch-up protection to industry-standard levels will not be compatible with the low leakage system needs.

A related difficulty in design is providing an on-chip testing capability for the signal chain. Since the overall system may be complex, it is valuable to have the ability to mimic the input signals normally being delivered to the data acquisition chip. As seen in FIG. 1, a test signal pin 120 may generally be connected to the input signal line 110. If a test signal is applied to the internal signal chain through a multiplexer 125, additional leakage paths can be introduced, and circuit performance during normal operation will be degraded.

Accordingly, there is a need for an electrical overstress protection circuit that minimizes or eliminates the effects of leakage currents introduced onto an input signal line while still providing overstress protection.

DETAILED DESCRIPTION

An electrical overstress protection circuit, in accordance with an embodiment of the present invention, may include an intermediate node receiving a reference voltage, a first pair of clamp devices, having opposite polarity, clamping an input signal line to the intermediate node, and a second pair of clamp devices, each clamping the intermediate node to one of two reference potentials. Accordingly, by clamping the input signal line to the intermediate node receiving the reference voltage, the amount of reverse leakage current into the input signal line can be reduced, thereby reducing noise on the input signal line, while still providing electrical overstress protection to the data receiver.

Undesired leakage currents may arise from, for example, large voltages present across the protection diodes and multiplexors. If these voltages are reduced to zero, the leakage currents may diminish or could disappear entirely. In one embodiment, a 'guard' node may be provided, and may be maintained at the same potential as the signal applied to input pin. Clamp devices may extend between input pin to a guard node, and may be connected in parallel and in opposite polarities to one another to absorb stress from either polarity. In, for example, the case of an X-ray data acquisition chip, the guard potential may be the summing voltage of the signal integration amplifiers, provided externally; in other applications, the guard potential could be derived by including an explicit voltage buffer on an input signal path. Additional clamp devices may also connect to the guard node to further prevent during EOS events, fault currents from propagate into the signal chain.

The guard node also may provide a path for on chip testing capability. Under normal system operation, the guard node may be well filtered, to avoid introducing noise into the input signals. But, if the guard voltage is intentionally perturbed, the capacitance of the protection junctions may couple a displacement charge corresponding to deterministic test signal that may be injected into the signal path.

In a system with many inputs operating at the same potential, only a single guard signal may be required, and when used for signal path testing, all inputs may be simultaneously tested.

Figure 2A:
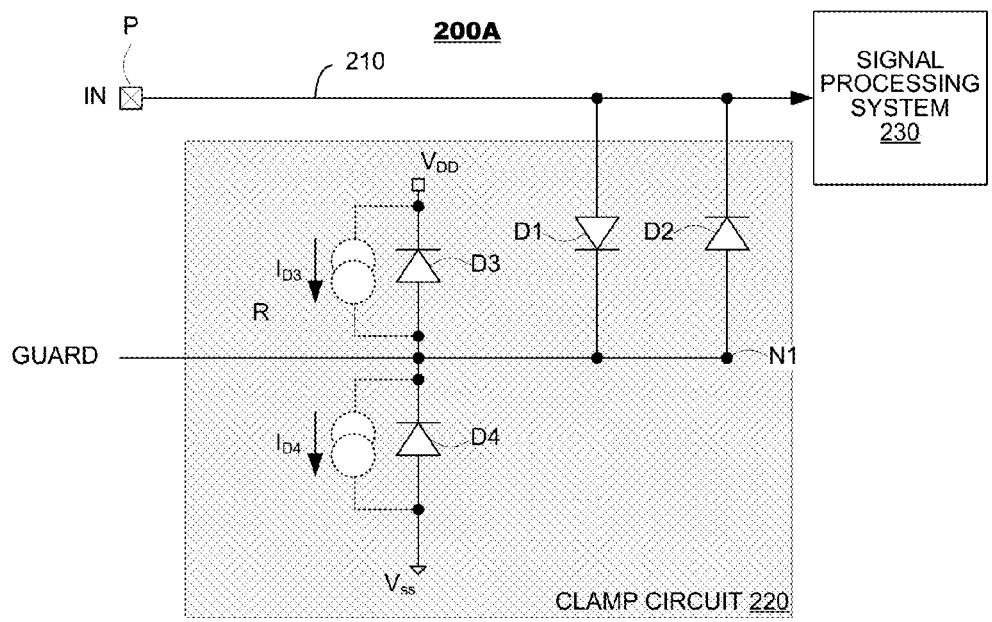
FIG. 2A illustrates an exemplary electrical overstress protection circuit in accordance with an embodiment of the present invention.

An exemplary embodiment of a data receiver 200A can be seen in FIG. 2A. The data receiver 200 may include an input signal line 210 receiving an input signal IN from an external source. The input signal IN may be received, for example, at a pin P on an integrated circuit (IC) package. The data receiver 200A may further include a signal processing system 230 for processing the input signal. In order to provide electrical overstress (EOS) protection a clamp circuit 220 may be provided. The clamp circuit may include an intermediate node N1 and a first pair of clamp devices D1 and D2 of opposite polarity coupling the input signal line 210 to the intermediate node N1. A second pair of clamp devices D3 and D4 may couple the intermediate node N1 to respective low impedance reference potentials ($V_{DD}$ and $V_{SS}$).

While the clamp devices illustrated in FIGS. 2A-5 are shown as diodes, other clamp devices can be used. For example, other clamp devices can include diode-connected transistors, actively-driven clamping transistors, silicon-controlled rectifiers (SCRs), Zener diodes, and strings of diodes in series.

In the embodiment shown in FIG. 2A, an input signal IN may have a time-varying current component reflecting information content of the input signal. The input signal may also have a constant DC offset voltage component. The GUARD voltage may be set to the expected value of the DC offset voltage component of the input signal.

During operation under ideal operating conditions, the voltage on the input signal line 210 and at the intermediate N1 would be the same. There should be no potential difference between the intermediate node N1 and the input signal line 110 and, therefore, there should be no leakage current between them. Accordingly, signal corruption effects that have been observed in prior designs can be avoided. However, when operating conditions are normal and not ideal, even when small voltage deviations may arise between the input signal line 210 and the intermediate node N1, for example significantly less than a diode voltage drop, leakage currents should be small and less than the magnitude of the picoampere current input signal.

Under normal operating conditions, there may be consistent voltage differences between the supply voltages $V_{DD}$ and $V_{SS}$ and intermediate node N1. Thus, leakage current events may be observed across clamp devices D3 and D4, which are represented by current sources $I_{D3}$, $I_{D4}$ in FIG. 2A. Such leakage currents should not affect operation of the input signal chain because the intermediate node N1 is maintained in isolation from the input signal line 210 by clamp devices D1 and D2. As a result, there should be minimal, if any, voltage difference between the intermediate node N1 and input signal line 110.

The GUARD voltage and the voltage at the input pin P may be the same value. During overstress events, the voltage at the input pin P may deviate from the GUARD voltage applied to the GUARD node. As a result, a voltage difference may develop between the input signal line 210 and the intermediate node N1, which may cause one of the clamp devices D1 or D2 to become forward-biased. The voltage at the intermediate node N1 may change under influence of one of the biased clamp devices, for example, D1 which ultimately may cause a corresponding one of the second pair of clamp devices D3, D4 to become forward-biased. Thus, the overstress voltage may be shunted to one of the low impedance reference voltage source $V_{DD}$ or $V_{SS}$, providing electrical overstress protection for the signal processing system 230. The voltage at the intermediate node N1 may be maintained to within two diode drops of $V_{DD}$ and $V_{SS}$ even in the presence of overstress voltage events.

Figure 2B:
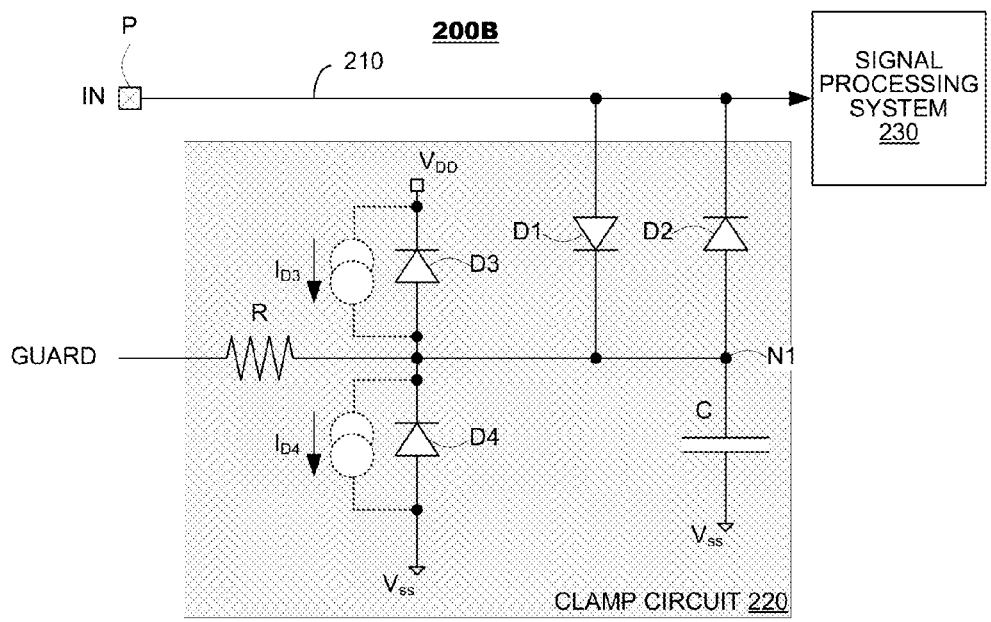
FIG. 2B illustrates another exemplary electrical overstress protection circuit in accordance with an embodiment of the present invention.

If the reference voltage GUARD or the reference potentials are expected to be noisy, a filter may be added to reduce the noise. FIG. 2B illustrates a data receiver 200B, similar to the data receiver in FIG. 2A, with a filter to reduce noise. The filter may further include a resistor capacitor (RC) network extending from a reference potential GUARD through the intermediate node N1 to one of the reference potentials $V_{DD}$ or $V_{SS}$. In the embodiment illustrated in FIG. 2B, the RC network is shown coupling the GUARD reference to reference voltage $V_{SS}$.

The RC network may filter noise that may be presented at intermediate node N1, to avoid coupling any such noise to the input signal line through parasitic coupling, such as junction capacitance of the clamp devices D1 and D2.

Figure 1:
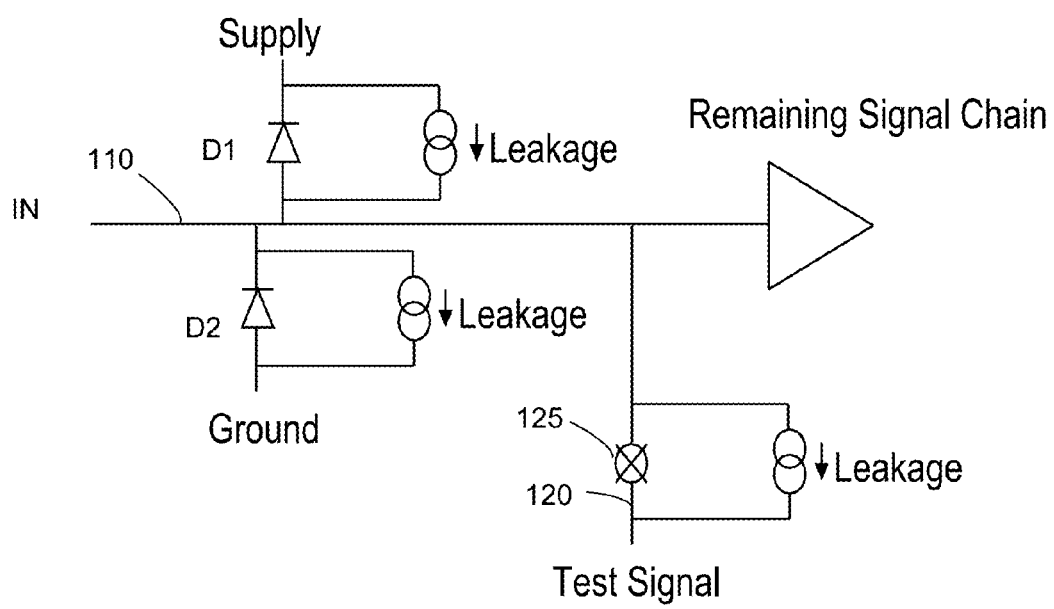
FIG. 1 illustrates a conventional electrical overstress protection circuit.

By way of example, consider an implementation in which $V_{DD}$ is set to 5 V; $V_{SS}$ to 0 V and the input signal is set to 2V but may vary by ±5 mV during run time. In this example, the guard voltage may be set to 2 V. Thus, there would be a 3 V differential across clamp device D3, a 2V differential across clamp device D4 and at most a 5 mV differential across clamp devices D1 or D2. With a 5 mV difference between node N1 and the input signal line 110, leakage currents into the input signal line may be expected to be less than one picoampere. By contrast, leakage currents across clamp devices D3 and D4 can be expected to be as much as one nanoampere, especially at high operating temperatures. Further, in the absence of the guard node as in the prior art of FIG. 1, the leakage currents across diodes D3 and D4 would be injected directly into the input signal line 110 (see FIG. 1), which would contribute to greater signal corruption.

Figure 3:
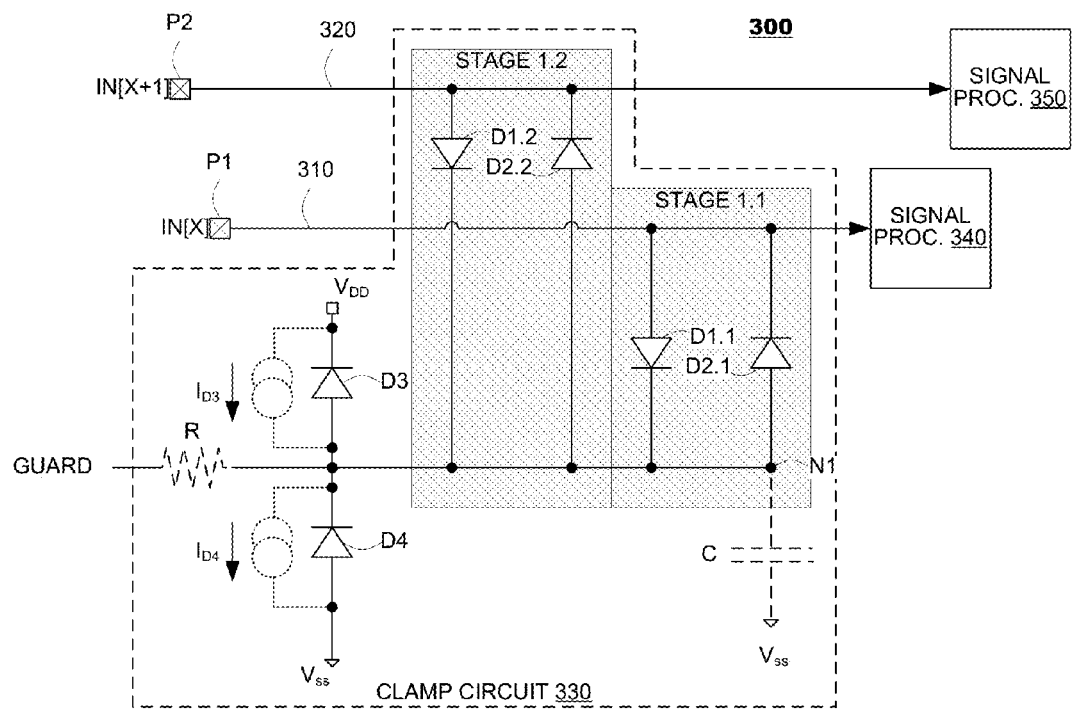
FIG. 3 illustrates yet another exemplary electrical overstress protection circuit in accordance with an embodiment of the present invention.

FIG. 3 illustrates another exemplary data receiver 300 according to another embodiment of the present invention. This embodiment illustrates the principles of FIGS. 2A and 2B extended to accommodate a plurality of input signal lines having common DC offset voltages. The data receiver 300 may include an input signal line 310 receiving an input signals IN[X] and an input signal line 320 receiving an input signal IN[X+1] from an external source. The input signals IN[X] and IN[X+1] may be received, for example, at pins P1 and P2, respectively, on an integrated circuit (IC) package. The data receiver 300 may further include a signal processing system 350 for processing the input signals IN[X] and IN[X+ 1]. Alternatively, signal processing systems 340 and 350 may process each of the respective input signals.

In order to provide electrical overstress (EOS) protection, a multistage clamp circuit 330 may be provided. The multistage clamp circuit 330 may include an intermediate node N1. In a first stage, stage 1.1, a first pair of clamp devices D1.1 and D2.1 of opposite polarity may couple the input signal line 310 to the intermediate node N1. In a second stage, stage 1.2, a second pair of clamp devices D1.2 and D2.2 of opposite polarity may couple the input signal line 320 to the intermediate node N1. A third pair of clamp devices D3 and D4 may couple the intermediate node to respective low impedance reference potentials ($V_{DD}$ and $V_{SS}$). The multistage clamp circuit 330 may, in an alternative embodiment, further include a resistor capacitor (RC) network extending from a reference potential GUARD through the intermediate node N1 to one of the reference potentials $V_{DD}$ or $V_{SS}$.

While FIG. 3 illustrates a data receiver 300 having two input signal lines 310 and 320, any number of input signal lines may be used. In this embodiment, the clamp device pairs may be replicated for each of the input signal lines as diode pairs D1.1/D2.1, D1.2/D2.2, etc. The clamp device pairs may be extended for as many input signal lines as are needed. The clamp devices D3, D4 of FIG. 3 would need not be replicated in an embodiment in which the DC voltage of all the input signal lines is the same; they may be "shared" in common by all signal lines. Alternatively, if the input data signal has multiple different DC offset voltages, the embodiments illustrated in FIGS. 2A/B could be repeated in the data receiver.

Figure 4:
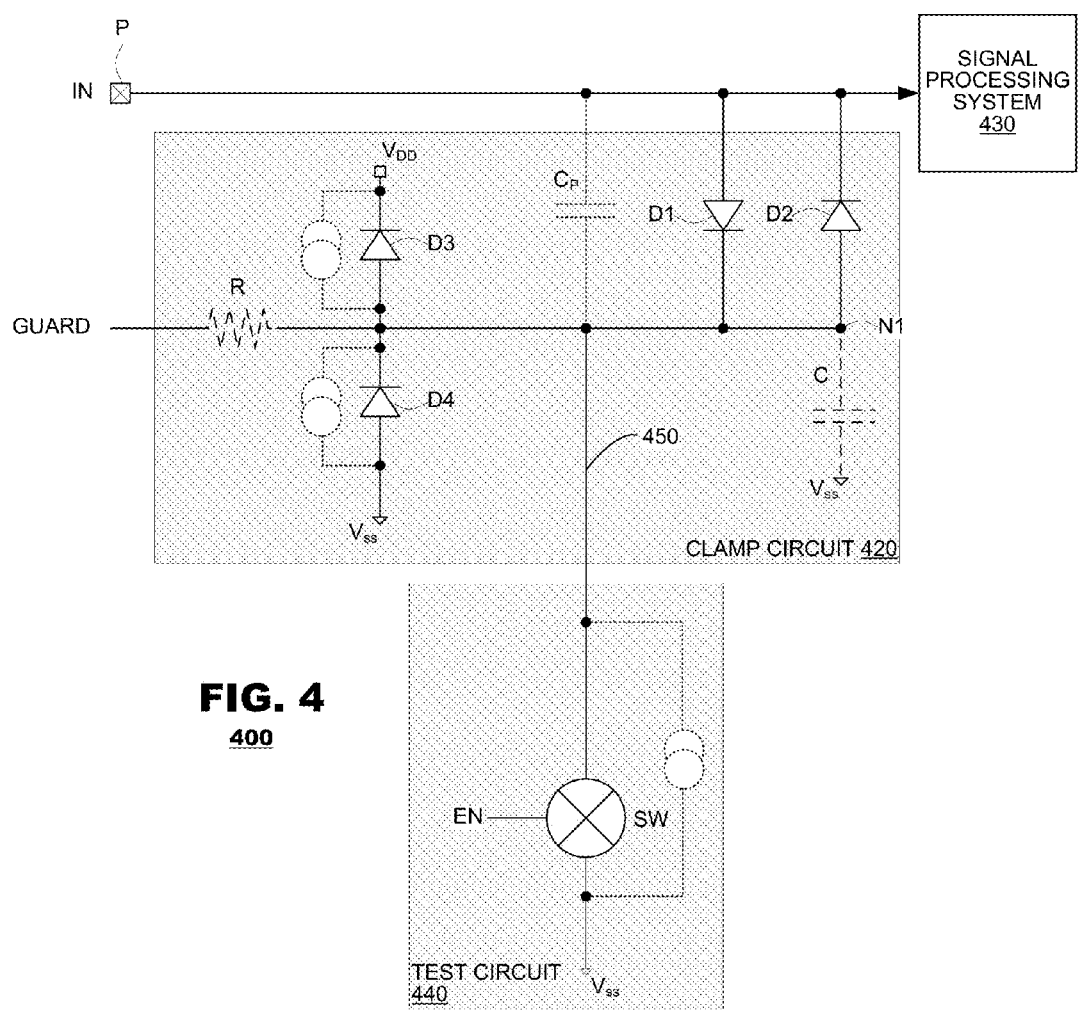
FIG. 4 illustrates a further exemplary electrical overstress protection circuit in accordance with an embodiment of the present invention.

FIG. 4 illustrates yet another exemplary data receiver 400 according to another embodiment of the present invention.

The data receiver 400 may include an input signal line 410, a clamp circuit 420, a signal processing system 430, and a test circuit 440. The input signal line 410 may receive an input signal IN from an external source. The input signal IN may be received, for example, at a pin P on an integrated circuit (IC) package. The data receiver 400 may further include a signal processing system 430 for processing the input signal. The clamp circuit 420 may provide EOS protection. The clamp circuit 420 may include an intermediate node N1, a first pair of clamp devices D1 and D2 of opposite polarity coupling the input signal line 410 to the intermediate node N1, and a second pair of clamp devices D3 and D4 may couple the intermediate node to respective low impedance reference potentials ($V_{DD}$ and $V_{SS}$). In addition, the clamp circuit 420 may include a test signal input 450 that may connect to intermediate node N1 for receiving a test signal from a test circuit 440. The clamp circuit 420 may optionally include a filter, such as a resistor capacitor (RC) network extending from a reference potential GUARD through the intermediate node N1 to one of the reference potential $V_{SS}$. The data receiver 400 may further include a test circuit 440 including a coupling switch SW and an output for outputting a test input data signal to the clamp circuit 420.

The data receiver 400 may operate as described above with respect to FIG. 2A or 2B. The data receiver 400 may maintain a guard voltage that is substantially the same as the voltage present on the signal line 410. Under such conditions, there would be no leakage currents into the signal line 410 through the clamp device pair D1/D2. Leakage currents may be present across clamp device pair D3, D4, but they would be isolated from the signal line 410. The clamp device pairs D1/D2 and D3/D4 provide overstress protection to the input signal line 410.

The test circuit 440 typically is disabled during runtime operation by disabling a coupling switch SW through the switch enable signal EN. The coupling switch SW may be a source of leakage current to the data receiver but, because the test circuit 440 is coupled to the intermediate node N1 rather than directly to the signal line 410, any leakage current may be shunted by either D3 or D4, and may be prevented from entering signal line 410 by either D1 or D2.

The test circuit 440 may be activated when the data receiver 400 is not operating in a run time mode, for example during validation testing of an integrated circuit or during a diagnostic operation. In such modes, it may be desirable for the test circuit 440 to inject a predetermined signal onto the signal line 410 to allow circuit designers to observe behavior of the data receiver system 400 and, particularly, the signal processing system 430. The clamp device pair D1/D2 may provide connectivity between the test circuit 440 and the signal line 410. The clamp devices D1, D2 provide direct DC coupling that involves a diode drop between node N1 and the input signal line 410. Additionally, the clamp device pair D1/D2 may introduce a parasitic capacitance between node N1 and the input signal line 310 (modeled as $C_P$ in FIG. 4.). During design, circuit designers may estimate AC and DC transfer functions between the intermediate node N1 and the input signal line 410 and estimate signal test patterns to be generated by the test circuit 440 to induce desired signal patterns on the input signal line 410.

In a multi-input configuration (e.g., the embodiment illustrated in FIG. 3), multiple input signal lines (e.g., input 310, 320) may share a test circuit 440 in the same way that clamp devices D3/D4 are shared.

Figure 5:
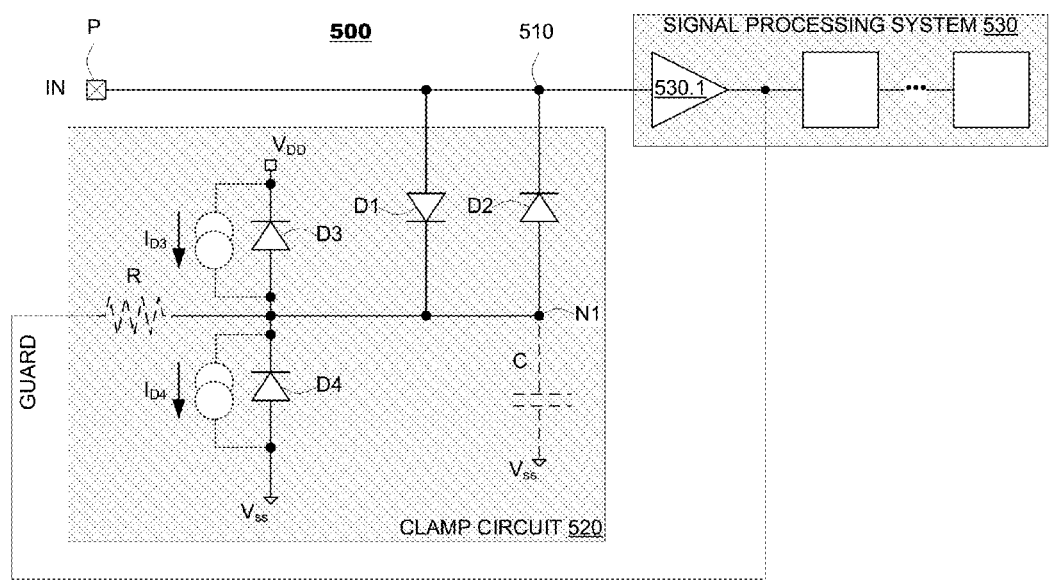
FIG. 5 illustrates yet another exemplary electrical overstress protection circuit in accordance with an embodiment of the present invention.

FIG. 5 illustrates yet another exemplary embodiment of a data receiver 500. The data receiver 500 may include an input signal line 510 receiving an input signal IN from an external source. The input signal IN may be received, for example, at a pin P on an integrated circuit (IC) package. The data receiver 500 may further include a signal processing system 530 for processing the input signal. In order to provide electrical overstress (EOS) protection a clamp circuit 520 may be provided. The clamp circuit may include an intermediate node N1 and a first pair of clamp devices D1 and D2 of opposite polarity coupling the input signal line 510 to the intermediate node N1. A second pair of clamp devices D3 and D4 may couple the intermediate node to respective low impedance reference potentials ($V_{DD}$ and $V_{SS}$). The signal processing system 530 may include a buffer/amplifier 530.1, which may provide a reference voltage GUARD to the intermediate node N1. Optionally, an RC network represented by resistor R and capacitor C may be provided in the clamp circuit 520 as shown in FIG. 5.

In the illustrated embodiment, the voltage of the input signal IN may vary over time. The signal processing system 530 may generate a GUARD signal whose voltage follows the time-varying components of the input signal IN. Thus, under ideal operating conditions, the guard signal may match the input signal IN. The voltage at node N1 would match the voltage on the input signal line 510 and leakage currents to the input signal line 510 would be minimized even though a time-varying voltage is present on the input signal line 510.

The GUARD reference voltage may be a constant DC offset voltage or may vary with time and may be generated by a variety of methods. For example, the GUARD reference voltage may be generated locally on a data receiver, such as a data acquisition chip, based upon a predetermined voltage. The data receiver may be constructed to generate a constant predetermined voltage or the data receiver may programmably generate a constant reference voltage based upon an input signal. The data receiver may also generate a time-varying GUARD reference voltage derived from a time-varying input signal as shown in FIG. 5.

Figure 6:
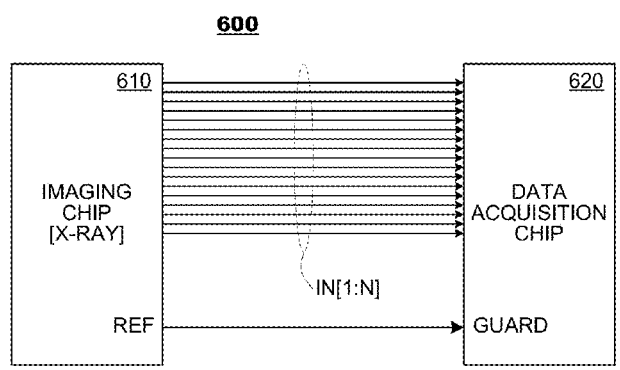
FIG. 6 illustrates an exemplary system using an exemplary electrical overstress protection circuit in accordance with an embodiment of the present invention.

In another embodiment the GUARD reference voltage may be generated by an external source. FIG. 6 illustrates an imaging chip 610, for example an X-RAY medical imaging device, which may output a plurality of data signals IN[1:N] and a reference voltage REF to a data acquisition chip 620. The data acquisition chip 620 may use the reference voltage REF as the GUARD voltage.

The FIG. 6 embodiment finds application with imaging chips that generate reference potentials representing a DC value of the input signals generated by the imaging chip. By deriving the guard voltage from the reference voltage output by the imaging chip, operation of the data receivers may be more accurate than locally-generated guard voltages, particularly if the DC values of the input signals include variations induced by variations induced by temperature, operating voltage and/or process.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:
1. An electrical overstress protection circuit, comprising:
a pair of clamp devices, having opposite polarity, connecting an input signal line to a common node; and
a second pair of clamp devices, each extending from the common node to a respective reference potential source,
wherein the common node is at an externally-supplied constant reference voltage.

2. The electrical overstress protection circuit of claim 1, wherein the clamp devices are diodes.

3. The electrical overstress protection circuit of claim 1, wherein the input data signal is a time-varying current signal.

4. The electrical overstress protection circuit of claim 1, wherein the input data signal is a time-varying voltage signal.

5. The electrical overstress protection circuit of claim 1, further comprising a plurality of input data signal lines, each data signal line connected to a plurality of clamping devices clamping each input signal line to the intermediate node.

6. The electrical overstress protection circuit of claim 1, further comprising a test circuit clamped to the intermediate node, the test circuit comprising a switch for connecting the test circuit to the intermediate node and a test signal input receiver for receiving a test input data signal.

7. The electrical overstress protection circuit of claim 1, further comprising an RC network extending from the reference voltage through the intermediate node to one of the first and second reference potentials.

8. The electrical overstress protection circuit of claim 1, wherein the externally-supplied constant reference voltage is supplied by an imaging chip reference voltage.

9. A data receiver including an electrical overstress protection circuit, comprising:
    an input signal line to receive an input data signal; and
    a clamp circuit receiving an externally-supplied constant reference voltage at an internal node, the clamp circuit comprising:
        a plurality of clamp devices clamping the input signal line to the internal node,
        a clamp device clamping the internal node to a first reference potential, and
        a clamp device clamping the internal node to a second reference potential.

10. The data receiver of claim 9, further comprising: an RC network extending from the reference voltage through the intermediate node to the second reference potentials.

11. The data receiver of claim 9, wherein the externally-supplied constant reference voltage is selected to correspond to a DC component of the input data signal.

12. The data receiver of claim 9, wherein the clamp devices are diodes.

13. The data receiver of claim 9, wherein the input signal is a time-varying current signal.

14. The data receiver of claim 9, wherein the input signal is a time-varying voltage signal.

15. The data receiver of claim 9, further comprising: a plurality of inputs for receiving input data signals; and a plurality of clamping devices clamping each input signal line to the intermediate node.

16. The data receiver of claim 9, further comprising: a test circuit connected to the intermediate node.

17. The data receiver of claim 16, the test circuit comprising:
    a switch for connecting the test circuit to the intermediate node; and
    a test signal outputting a test data signal.

18. The data receiver of claim 9, wherein the externally-supplied constant reference voltage is supplied by an imaging chip reference voltage.

19. The data receiver of claim 9, wherein the plurality of clamp devices clamping the input signal line to the internal node include at least a pair of clamp devices having opposite polarity.

20. An overstress protection circuit for an input signal line of an integrated circuit, comprising:
    a two-stage clamping circuit coupling the input signal line to a pair of reference potential sources, a first stage of the clamping circuit extending from the input signal line to an internal node and a second stage of the clamping circuit extending from the internal node to at least one reference potential, and
    a signal source providing an externally-supplied constant reference voltage at the internal node.

21. The overstress protection circuit of claim 20, further comprising:
    a filter extending from the input signal line through the intermediate node to one of the first and second reference potentials.

22. The overstress protection circuit of claim 20, wherein the externally-supplied constant reference voltage is selected to correspond to a DC component of the input signal.

23. The electrical overstress protection circuit of claim 1, wherein the externally-supplied constant reference voltage is selected to correspond to a DC component of the input signal.

24. The overstress protection circuit of claim 20, wherein the two-stage clamping circuit includes at least a pair of diodes.

25. The overstress protection circuit of claim 20, wherein the input signal line carries a time-varying current signal.

26. The overstress protection circuit of claim 20, wherein the input signal line carries a time-varying voltage signal.

27. The overstress protection circuit of claim 20, wherein the signal source is a reference voltage from an imaging chip.

28. The overstress protection circuit of claim 20, wherein the first stage of the clamping circuit includes at least a pair of clamp devices where the devices having opposite polarity.

* * * * *